US011526086B2

(12) United States Patent
Hill et al.

(10) Patent No.: US 11,526,086 B2
(45) Date of Patent: Dec. 13, 2022

(54) MULTI-FIELD SCANNING OVERLAY METROLOGY

(71) Applicant: KLA Corporation, Milpitas, CA (US)

(72) Inventors: Andrew V. Hill, Berkeley, CA (US); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/195,507

(22) Filed: Mar. 8, 2021

(65) Prior Publication Data

US 2022/0283514 A1    Sep. 8, 2022

(51) Int. Cl.
G03F 7/20 (2006.01)
G01N 21/95 (2006.01)
G01N 21/956 (2006.01)

(52) U.S. Cl.
CPC ..... *G03F 7/70633* (2013.01); *G01N 21/9501* (2013.01); *G01N 21/956* (2013.01)

(58) Field of Classification Search
CPC ..... G01B 11/02; G01B 11/022; G01B 11/024; G01B 11/026; G01B 11/028; G01B 11/03; G01B 11/04; G01B 11/043; G01B 11/046; G01B 11/06; G01B 11/14; G01B 11/16; G01B 11/165; G01B 11/22; G01B 11/24; G01B 11/26; G03F 7/70633; G03F 7/70616; G03F 7/70641; G03F 7/7065; G01N 21/9501; G01N 21/956
See application file for complete search history.

(56) References Cited

U.S. PATENT DOCUMENTS

| 6,211,955 B1 | 4/2001 | Basiji et al. |
| 6,710,876 B1 * | 3/2004 | Nikoonahad ....... G03F 7/70633 356/399 |
| 7,528,943 B2 | 5/2009 | Brown et al. |
| 7,782,452 B2 * | 8/2010 | Mehanian .......... G01N 21/9501 356/237.2 |
| 7,808,638 B2 * | 10/2010 | Bevis ..................... G01N 21/47 356/401 |
| 8,760,662 B2 | 6/2014 | Boef et al. |
| 9,426,400 B2 | 8/2016 | Brown et al. |

(Continued)

OTHER PUBLICATIONS

International Search Report and Written Opinion in PCT/US2022/016886 dated Jun. 14, 2022, 10 pages.

*Primary Examiner* — Gordon J Stock, Jr.
(74) *Attorney, Agent, or Firm* — Suiter Swantz pc llo

(57) ABSTRACT

A metrology tool may include an illumination sub-system to illuminate sample within two or more acquisition fields with two or more illumination beams, where the two or more acquisition fields are distributed along a scan direction in a non-overlapping configuration, and where a translation stage translates a metrology target on the sample along the scan direction sequentially through the two or more acquisition fields. The metrology tool may further include an imaging sub-system to image the two or more acquisition fields while the sample is scanned along the scan direction. The imaging sub-system may include a field-repositioning optical relay to relay images of the two or more acquisition fields to a scanning detector including one or more pixel columns distributed along a column direction, where the field-repositioning optical relay positions the images of the two or more acquisition fields on the scanning detector along the column direction.

36 Claims, 8 Drawing Sheets

(56) References Cited

U.S. PATENT DOCUMENTS

| | | | |
|---|---|---|---|
| 10,401,738 B2* | 9/2019 | Hill | G01B 11/14 |
| 10,782,616 B2* | 9/2020 | Wang | G03F 9/7046 |
| 11,073,768 B2* | 7/2021 | Hill | G01N 21/956 |
| 11,118,903 B2* | 9/2021 | Hill | G01B 11/272 |
| 11,162,897 B2* | 11/2021 | Antonelli | G01B 11/24 |
| 2003/0179369 A1 | 9/2003 | Feldman et al. | |
| 2007/0146693 A1* | 6/2007 | Brown | G01N 21/95607 356/237.2 |
| 2017/0058343 A1 | 3/2017 | Quintel et al. | |
| 2019/0331903 A1 | 10/2019 | Wald et al. | |
| 2020/0409271 A1 | 12/2020 | Hill et al. | |
| 2021/0072021 A1 | 3/2021 | Hill et al. | |
| 2021/0096061 A1 | 4/2021 | Hill et al. | |
| 2022/0034652 A1 | 2/2022 | Hill et al. | |

* cited by examiner

MULTI-FIELD SCANNING OVERLAY METROLOGY

TECHNICAL FIELD

The present disclosure relates generally to scanning metrology and, more particularly, to providing multiple optical configurations in a single metrology scan.

BACKGROUND

Scanning metrology systems interrogate a sample as the sample is in motion and provide a promising approach to achieving high-throughput measurements to meet increasing demands on the number and/or sensitivity of metrology measurements. However, scanning metrology presents additional challenges when multiple measurements of a particular location on a sample (e.g., a location of a metrology target) with different measurement parameters are desired. For example, performing multiple scans of the sample with different illumination or collection configurations may provide a desired dataset, but the time required for multiple scans may offset the throughput capabilities of scanning metrology. By way of another example, splitting collected light into multiple paths based on certain optical parameters of the collected light such as wavelength or polarization may provide some ability to generate measurements using different collection conditions, but this approach lacks the ability to modify illumination parameters during a scan and inefficiently uses illumination light resulting in increased measurement noise. It is therefore desirable to provide systems and methods to cure the above deficiencies.

SUMMARY

A metrology tool is disclosed in accordance with one or more illustrative embodiments of the present disclosure. In one illustrative embodiment, the metrology tool includes an illumination sub-system to illuminate a sample within two or more acquisition fields with two or more illumination beams, where the two or more acquisition fields are distributed along a scan direction in a non-overlapping configuration, and where a translation stage translates a metrology target on the sample along the scan direction sequentially through the two or more acquisition fields. In another illustrative embodiment, the metrology tool includes an imaging sub-system to image the two or more acquisition fields while the sample is scanned along the scan direction by the translation stage. In another illustrative embodiment, the imaging sub-system includes an objective lens to capture light from a sample within a measurement field of view, where the two or more acquisition fields are within the measurement field of view. In another illustrative embodiment, the imaging sub-system includes a scanning detector including one or more pixel columns distributed along a column direction to generate two or more images of the two or more acquisition fields as the sample is scanned. In another illustrative embodiment, the imaging sub-system includes a field-repositioning optical relay to relay images of the two or more acquisition fields to the scanning detector, where the field-repositioning optical relay positions the images of the two or more acquisition fields on the scanning detector along the column direction such that the scan direction in the two or more acquisition fields is orthogonal to the column direction.

A metrology tool is disclosed in accordance with one or more illustrative embodiments of the present disclosure. In one illustrative embodiment, the metrology tool includes one or more illumination sources. In another illustrative embodiment, the metrology tool includes a translation stage to translate a sample along a scan direction. In another illustrative embodiment, the metrology tool includes an illumination sub-system to illuminate a sample within two or more acquisition fields with two or more illumination beams from the one or more illumination sources, where the two or more acquisition fields are distributed along a scan direction in a non-overlapping configuration, and where a translation stage translates a metrology target on the sample along the scan direction sequentially through the two or more acquisition fields. In another illustrative embodiment, the metrology tool includes an imaging sub-system to image the two or more acquisition fields while the sample is scanned along the scan direction by the translation stage. In another illustrative embodiment, the imaging sub-system includes an objective lens to capture light from a sample within a measurement field of view, where the two or more acquisition fields are within the measurement field of view. In another illustrative embodiment, the imaging sub-system includes a scanning detector including one or more pixel columns distributed along a column direction to generate two or more images of the two or more acquisition fields as the sample is scanned. In another illustrative embodiment, the imaging sub-system includes a field-repositioning optical relay to relay images of the two or more acquisition fields to the scanning detector, where the field-repositioning optical relay positions the images of the two or more acquisition fields on the scanning detector along the column direction such that the scan direction in the two or more acquisition fields is orthogonal to the column direction. In another illustrative embodiment, the metrology tool includes a controller communicatively coupled to the imaging sub-system. In another illustrative embodiment, the controller receives two or more images of the sample associated with the two or more acquisition fields. In another illustrative embodiment, the controller generates a metrology measurement associated with the sample based on the two or more images.

A metrology method is disclosed in accordance with one or more illustrative embodiments of the present disclosure. In one illustrative embodiment, the method includes illuminating a sample within two or more acquisition fields with two or more illumination beams within a measurement field of view of an objective lens, where the two or more acquisitions are distributed along a scan direction in a non-overlapping configuration. In another illustrative embodiment, the method includes translating the sample along the scan direction sequentially through the two or more acquisition fields. In another illustrative embodiment, the method includes relaying images of the two or more acquisition fields through the objective lens to a scanning detector using a field-repositioning optical relay, where the field-repositioning optical relay positions the images of the two or more acquisition fields on the scanning detector along the column direction such that the scan direction in the two or more acquisition fields is orthogonal to the column direction. In another illustrative embodiment, the method includes generating two or more images of the sample associated with the two or more acquisition fields. In another illustrative embodiment, the method includes generating a metrology measurement associated with the sample based on the two or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
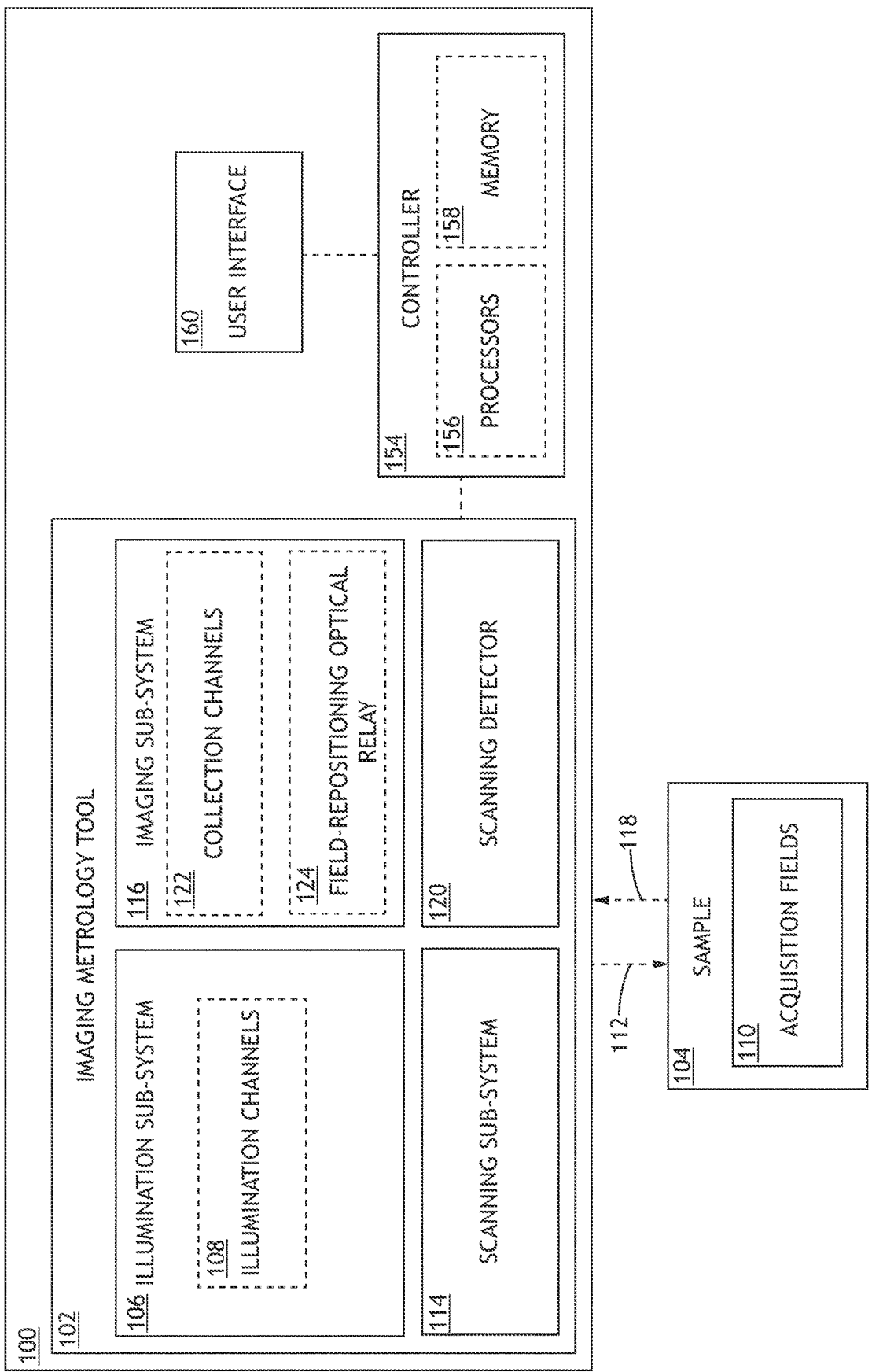
FIG. 1A is a block diagram of a scanning metrology system in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for performing multiple measurements of a metrology target or other sample location using different illumination and/or collection parameters (e.g., measurement recipes) in a single scan with a scanning metrology system. In this regard, high measurement sensitivity may be achieved through the combination of multiple measurements using the different measurement recipes in a single scan to provide high throughput measurements. For the purposes of the present disclosure, the term metrology target is used to generally describe a portion of the sample to be interrogated using a metrology system. In this way, the term metrology target may include, but is not limited to, dedicated metrology targets (e.g., portions of the sample having features designed to facilitate metrology) or portions of device features suitable for direct metrology measurements.

An optical metrology tool is typically configurable according to a recipe including a set of parameters for controlling the illumination of a sample as well as the collection of light from the sample. It is recognized herein that different optical metrology techniques may require different illumination profiles of light on the sample and may further utilize light from different portions of the collection pupil for a measurement. For example, a recipe of an optical metrology tool may include illumination parameters such as, but not limited to, an illumination intensity, an illumination wavelength, an illumination pupil distribution (e.g., a distribution of illumination angles and associated intensities of illumination at those angles), a polarization of incident illumination, a spatial distribution of illumination, or a sample height (e.g., target focus). By way of another example, a recipe of an optical metrology tool may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

Further, various metrology target designs, measurement techniques, and corresponding metrology tools have been developed, where different techniques may utilize different measurement recipes. For example, in the case of image-based overlay metrology, image-based overlay metrology tools may illuminate an overlay target having non-overlapping resolvable features associated with two or more lithographic exposures on one or more sample layers (e.g., an advanced imaging metrology (AIM) target, a box-in-box metrology target, or the like) and capture an overlay signal including an image of the overlay target based on a variety of imaging techniques including, but not limited to, brightfield imaging or dark-field imaging. Accordingly, overlay may be determined by measuring the relative positions of the overlay target features in the captured image (e.g., a field plane distribution). Further, a pupil mask in a collection pupil may be used to selectively block (and pass) certain diffraction orders from periodic structures on the sample. In this way, the properties of the resulting images may be highly tailored to provide sensitive metrology measurements using corresponding metrology algorithms. Metrology on moving samples and associated metrology target layouts are described generally in U.S. patent application Ser. No. 16/586,504 filed on Sep. 27, 2019, U.S. patent application Ser. No. 16/598,146 filed on Oct. 10, 2019, and U.S. patent application Ser. No. 17/140,999 filed on Jan. 4, 2021, all of which are incorporated herein by reference in the entirety. By way of another example, scatterometry-based overly metrology tools may illuminate a grating-over-grating metrology target including periodic structures on two or more sample layers in overlapping regions (e.g., associated with lithographic exposures on those layers) and capture an overlay signal including an angular distribution of light emanating from the overlay target associated with diffraction, scattering, and/or reflection of the illumination beam from the grating-over-grating structure. The overlay may then be determined based on one or more images generated based on one or more selected diffraction orders. For instance, one or more images may be generated of the overlay target based on a single diffraction order. In this way, the features of the overlay target may not be resolved, but the overlay may be determined based on a comparison of the intensity or gray level of the imaged target region when imaged with symmetrically-opposed illumination. Scanning scatterometry overlay is described generally in U.S. patent application Ser. No. 17/140,999 filed on Jan. 4, 2021, which is incorporated by reference herein in its entirety.

It is contemplated herein that the systems and methods disclosed herein may be suitable for any scanning metrology technique including, but not limited to, imaging techniques in which metrology target features are fully resolved, scatterometry techniques in which metrology target features are not fully resolved, or any diffraction-based technique in which metrology signals are generated based on selected diffraction orders generated by a metrology target.

It is contemplated herein that the sensitivity and/or accuracy of a metrology measurement (e.g., an overlay metrology measurement) may be improved by collecting multiple measurement signals with different measurement recipes (e.g., illumination and/or collection parameters), which may be associated with the same or different measurement techniques (e.g., imaging or scatterometry techniques). For example, different measurement conditions may provide different measurement accuracies and/or may be more or less sensitive to particular sources of measurement error such as, but not limited to, asymmetric features, tool induced shift (TIS) error, or the degree to which a measurement of a metrology target accurately characterizes device features of interest. Accordingly, measurements of a common portion of a sample such as a metrology target with different measurement conditions may facilitate robust and accurate measurements.

It is further contemplated herein that acquiring multiple measurements of a particular location of a sample (e.g., a location of a metrology target) may be straightforward when the sample is static. In particular, the measurement recipe may be sequentially varied for sequential measurements prior to moving the sample. However, acquiring multiple measurements of a sample with different measurement recipes presents additional challenges.

In some embodiments, a scanning metrology system defines two or more acquisition fields (or sub-fields) within a measurement field of view, where the acquisition fields are distributed along a scan direction such that a metrology target or other portion of the sample to be measured sequentially passes through each of the acquisition fields during a scan. The scanning metrology system may further include one or more field-repositioning relay optics to reposition and/or rotate the positions of the acquisition fields onto a scanning sensor such that the two or more acquisition fields are distributed onto a line direction orthogonal to a scan direction. For example, a scanning sensor may generate an image one line of pixels at a time as the sample is translated along the scan direction. The field-repositioning relay optics may thus distribute each acquisition field to different sets of pixels in the scanning sensor (or possibly different adjacent sensors). As the sample is scanned through the two or more acquisition fields, the metrology target will sequentially appear in each of the different sets of pixels of the scanning sensor. This configuration may be suitable for, but not limited to, imaging with time-delay-integration (TDI) sensors in which motion of the sample is synchronized to charge transfer between pixel rows along the scan direction to increase the effective exposure time of the resulting image.

The field-repositioning relay optics may include any combination of optical elements suitable for transposing and/or rotating the acquisition fields to be distributed along the line direction of a line-scan sensor rather than the scan direction. In one embodiment, the field-repositioning relay optics include separated or decentered optical elements to separately relay the two or more acquisition fields to an intermediate field plane in the transposed orientation. Further, the field-repositioning relay optics may include image rotating elements such as k-mirrors, dove prisms, or the like to rotate the acquisition fields to facilitate generation of a continuous image as the sample is scanned along the scan direction.

It is contemplated herein that this configuration may allow separate measurements of each of the acquisition fields with different measurement recipes (e.g., different illumination and/or collection parameters). In one embodiment, the scanning metrology system provides separate illumination channels for each (or at least some) of the acquisition fields to facilitate independent control of various illumination parameters such as, but not limited to, wavelength, polarization, incidence angle (e.g., illumination pupil control), illumination field (e.g., illumination field control), or the like. Further, a scanning metrology system may incorporate any combination of outside-the-lens (OTL) and through-the-lens (TTL) illumination techniques. For example, OTL and TTL illumination are generally described in U.S. patent application Ser. No. 16/996,328 filed on Aug. 18, 2020 and U.S. patent application Ser. No. 17/140,999 filed on Jan. 4, 2021, both of which are incorporated herein by reference in their entirety. In another embodiment, the scanning metrology system includes a separate collection channel for each (or at least some) of the acquisition fields to facilitate independent control of various collection parameters such as, but not limited to, polarization filtering, wavelength filtering, collection pupil control (e.g., to block selected diffraction orders to implement a selected metrology algorithm), collection field control (e.g., to select a collection field of view on the sample), or the like. For example, the scanning metrology system may include a field relay to generate an intermediate collection field plane and/or an intermediate collection pupil plane for each (or at least some) of the collection channels.

Referring now to FIGS. 1A-4, systems and methods for scanning metrology with multiple measurement recipes are described in greater detail in accordance with one or more embodiments of the present disclosure.

FIG. 1A is a block diagram of a scanning metrology system 100 in accordance with one or more embodiments of the present disclosure.

In one embodiment, the scanning metrology system 100 includes an imaging metrology tool 102 to acquire metrology signals from metrology targets or other measurable portions of a sample 104. For example, the imaging metrology tool 102 may include, but is not limited to, an overlay metrology tool to perform overlay measurements.

In one embodiment, the imaging metrology tool 102 includes an illumination sub-system 106 with two or more illumination channels 108 to illuminate two or more acquisition fields 110 on the sample 104 with illumination in the form of two or more illumination beams 112. Each of the two or more illumination channels 108 may direct an illumination beam 112 to a particular acquisition field 110. Further, each acquisition field 110 may be illuminated by one or more illumination channels 108 either simultaneously or sequentially. In this way, various illumination parameters such as, but not limited to, intensity, wavelength, polarization, or incidence angle may be independently tailored for each illumination channel 108 and acquisition field 110. For example, the one or more illumination beams 112 may be angularly limited such that periodic structures (e.g., in one or more cells of a metrology target) may generate discrete diffraction orders. Further, the one or more illumination beams 112 may be spatially limited such that they may illuminate selected portions of the sample 104 within an acquisition field 110. For instance, each of the one or more illumination beams 112 may be spatially limited to illuminate a particular cell of a metrology target.

In another embodiment, the imaging metrology tool 102 includes a scanning sub-system 114 to translate the sample 104 with respect to the illumination sub-system 106 and the imaging sub-system 116. For example, the scanning sub-system 114 may include one or more actuators or translation stages secured to the sample 104 and/or or a portion of the imaging sub-system 116 (e.g., an objective lens).

In another embodiment, the scanning metrology system 100 includes an imaging sub-system 116 to collect light from the two or more acquisition fields 110 (e.g., measurement light 118) and direct the light to a scanning detector 120. For example, the two or more acquisition fields 110 may be distributed within a measurement field of view of the imaging sub-system 116 (e.g., a field of view of an objective lens used to collect the measurement light 118). The imaging sub-system 116 may further include two or more collection channels 122, where each collection channel 122 may be associated with a particular acquisition field 110. Accordingly, various collection parameters associated with the measurement light 118 from each acquisition field 110 such as, but not limited to, wavelength, polarization, or collection angle may be independently controlled.

The scanning detector 120 may include any type or combination of sensors known in the art suitable for capturing measurement light 118 as the sample 104 is scanned. In one embodiment, the scanning detector 120 includes a line-scan detector including a single row of pixels distributed along a column direction 206 to continuously generate an image one line of pixels at a time as the sample 104 is scanned along a scan direction 202 orthogonal to the column direction 206. In another embodiment, the scanning detector 120 includes a time-delay integration (TDI) detector. A TDI detector may generate a continuous image of the sample 104 when the motion of the sample 104 is synchronized to charge-transfer clock signals in the TDI detector. In particular, a TDI detector acquires charge from light exposure on multiple columns of pixels and includes clock pulses to transfer charge between adjacent columns of pixels along the scan direction 202. When the motion of the sample 104 along the scan direction 202 is synchronized to the charge transfer in the TDI detector, charge continuously accumulates during the scan. This process continues until the charge reaches a final column of pixels and is subsequently read out of the TDI detector. In this way, images of the object are accumulated over a longer time frame than would be possible with a simple line-scan camera. This relatively longer acquisition time decreases the photon noise level in the image. Further, synchronous motion of the image and charge may prevent blurring in the recorded image.

In another embodiment, the scanning detector 120 includes a bi-directional detector in which two continuous images are generated based on readouts in opposite directions. In this configuration, a single bi-directional detector may simultaneously generate two continuous images. For example, a bi-directional TDI detector may have two sets of pixel columns with opposite charge transfer directions. Imaging with a bi-directional detector is described generally in U.S. Pat. No. 7,528,943 filed on Dec. 27, 2005 and U.S. Pat. No. 9,426,400 filed on Dec. 10, 2012, both of which are incorporated herein by reference in their entireties.

Figure 2A:
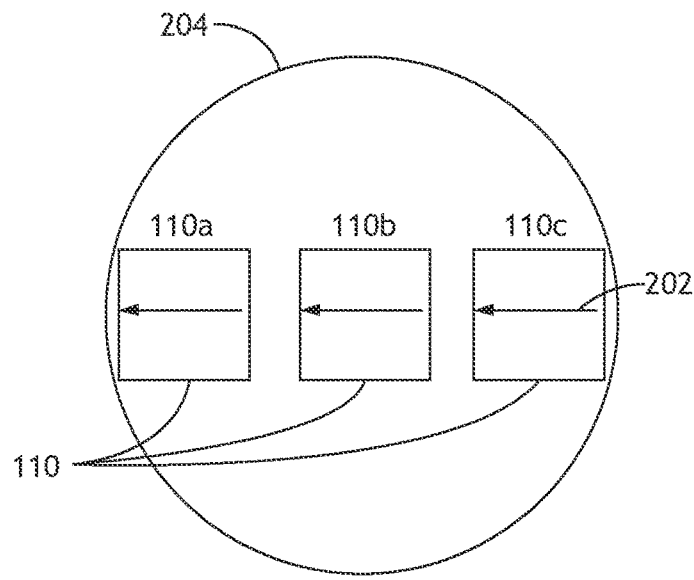
FIG. 2A is a top view of a sample illustrating an arrangement of acquisition fields in accordance with one or more embodiments of the present disclosure.

FIG. 2A is a top view of a sample 104 illustrating an arrangement of acquisition fields 110 in accordance with one or more embodiments of the present disclosure. In one embodiment, two or more acquisition fields 110 are linearly distributed along a scan direction 202 and lie within the measurement field of view 204 of the imaging sub-system 116 (e.g., a field of view of an objective lens of the imaging sub-system 116). In this configuration, a metrology target (or other desired portion of the sample 104 to be measured) may sequentially pass through the acquisition fields 110 as the sample 104 is scanned. In particular, FIG. 2A illustrates three acquisition fields 110a,b,c within the measurement field of view 204 arranged such that a metrology target sequentially passes through acquisition field 110a, acquisition field 110b, then acquisition field 110c during a scan.

In another embodiment, the scanning metrology system 100 includes a field-repositioning optical relay 124 to reposition images of the acquisition fields 110 to facilitate arrangement of the acquisition fields 110 along the column direction of the scanning detector 120. For example, the field-repositioning optical relay 124 may relay acquisition fields 110 located in one intermediate field plane in the imaging sub-system 116 to another intermediate field plane, where the field-repositioning optical relay 124 individually images, repositions, and/or rotates the acquisition fields 110 between the two intermediate field planes.

It is contemplated herein that simply imaging the measurement field of view 204 (e.g., as illustrated in FIG. 2A) onto the scanning detector 120 may be unsuitable for generating separate images of the acquisition fields 110, particularly with a TDI detector. For example, a scanning detector 120 may include one or more columns of pixels, where pixels in each column are distributed along a column direction. In this way, the scanning detector 120 may generate a continuous image of the sample 104 as the sample 104 is scanned along the scan direction 202 orthogonal to the column direction. In this configuration, positioning the column direction of the scanning detector 120 orthogonal to the scan direction to generate a continuous image of the sample would result in sequential imaging of the multiple acquisition fields 110. In the case that a TDI detector is used, this configuration may lead to blending of the images of the acquisition fields 110.

In one embodiment, the field-repositioning optical relay 124 may reposition or otherwise redistribute the acquisition fields 110 along the column direction of a scanning detector 120 and may further rotate the images of the acquisition fields 110 such that the scan direction is orthogonal to the column direction of the scanning detector 120. In another embodiment, the field-repositioning optical relay 124 may reposition or otherwise redistribute the acquisition fields 110 along the column directions of two or more separate scanning detectors 120 and may further rotate the images of the acquisition fields 110 such that the scan direction is orthogonal to the column direction of each scanning detector 120.

Figure 2B:
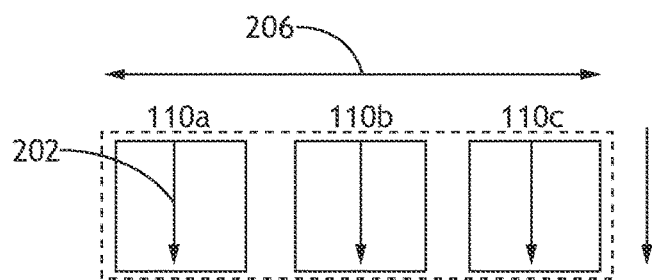
FIG. 2B is a top view of a face of a scanning detector on which the acquisition fields have been repositioned by the field-repositioning optical relay in accordance with one or more embodiments of the present disclosure.

FIG. 2B is a top view of a face of a scanning detector 120 on which the acquisition fields 110 have been repositioned by the field-repositioning optical relay 124 in accordance with one or more embodiments of the present disclosure. As illustrated in FIG. 2B, the acquisition fields 110a,b,c are distributed along the column direction 206 of the scanning detector 120, and the scan direction 202 in each of the acquisition fields 110 is orthogonal to the column direction 206. As a result, a continuous image generated by the scanning detector 120 may include separate regions for each of the acquisition fields 110. In particular, each acquisition field 110 may be associated with a fixed set of pixels of the scanning detector 120 along the column direction 206. Alternatively, in the case of multiple scanning detectors 120, one or more acquisition fields 110 may be imaged onto separate scanning detectors 120 that may each provide separate images.

Figure 2C:
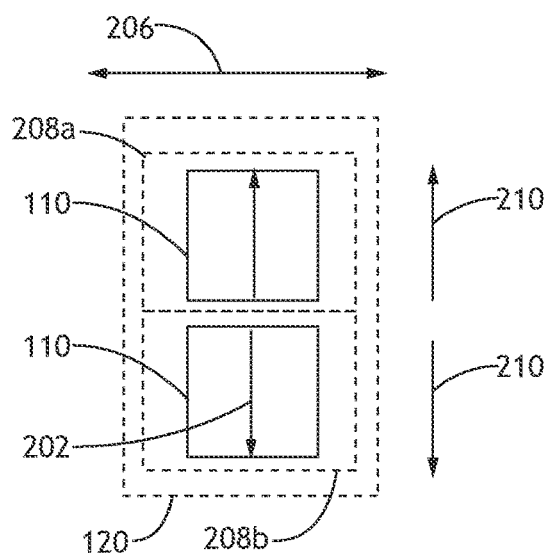
FIG. 2C is a top view of a face of a scanning detector with a bi-directional scan sensor on which the acquisition fields have been repositioned by the field-repositioning optical relay in accordance with one or more embodiments of the present disclosure.

FIG. 2C is a top view of a face of scanning detector 120 with a bi-directional scan sensor on which the acquisition fields 110 have been repositioned by the field-repositioning optical relay 124 in accordance with one or more embodiments of the present disclosure. In particular, FIG. 2C illustrates a configuration with two acquisition fields 110 distributed along the scan direction 202 rather than three as illustrated in FIG. 2A.

As described previously herein a bi-directional detector may include two sets of pixel columns 208a,b to simultaneously generate two continuous images. For example, a bi-directional TDI detector may have opposite charge transfer directions for the two sets of pixel columns 208a,b. In one embodiment, the field-repositioning optical relay 124 positions one acquisition field 110 to the first set of pixel columns 208a and positions a second acquisition field 110 to the second set of pixel columns 208b. Further, as illustrated in FIG. 2C, the two acquisition fields 110 may be rotated such that the scan direction 202 for the two acquisition fields 110 are in opposite directions. In this way, separate images of the two acquisition fields 110 may be generated using a single bi-directional scanning detector 120. In the case of a bi-directional TDI detector, the charge transfer direction 210 may also align with the scan direction 202 for each acquisition field 110.

Similarly, the concepts illustrated in FIG. 2C may be suitable for configurations of the imaging metrology tool 102 providing even numbers of acquisition fields 110. For example, the field-repositioning optical relay 124 may reposition (and rotate if necessary) pairs of acquisition fields 110 onto multiple bi-directional detectors.

Referring now to FIGS. 1B-3B, various configurations of the scanning metrology system 100 providing multiple measurements of a metrology target or other portion of the sample in sequential acquisition fields 110 with different measurement recipes are described in greater detail in accordance with one or more embodiments of the present disclosure.

Figure 1B:
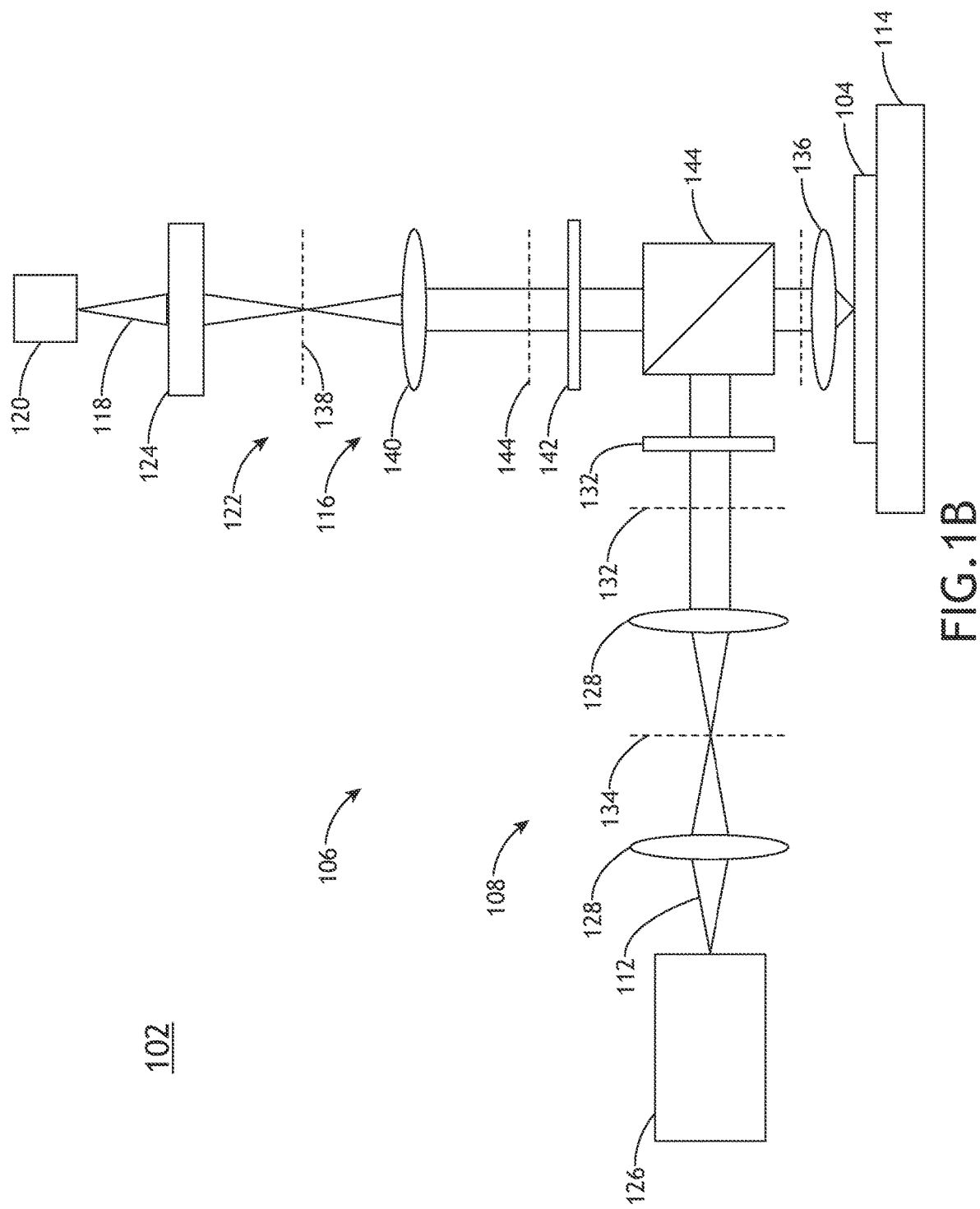
FIG. 1B is a conceptual view of the imaging metrology tool illustrating a single illumination channel illuminating a single acquisition field, in accordance with one or more embodiments of the present disclosure.
Figure 3A:
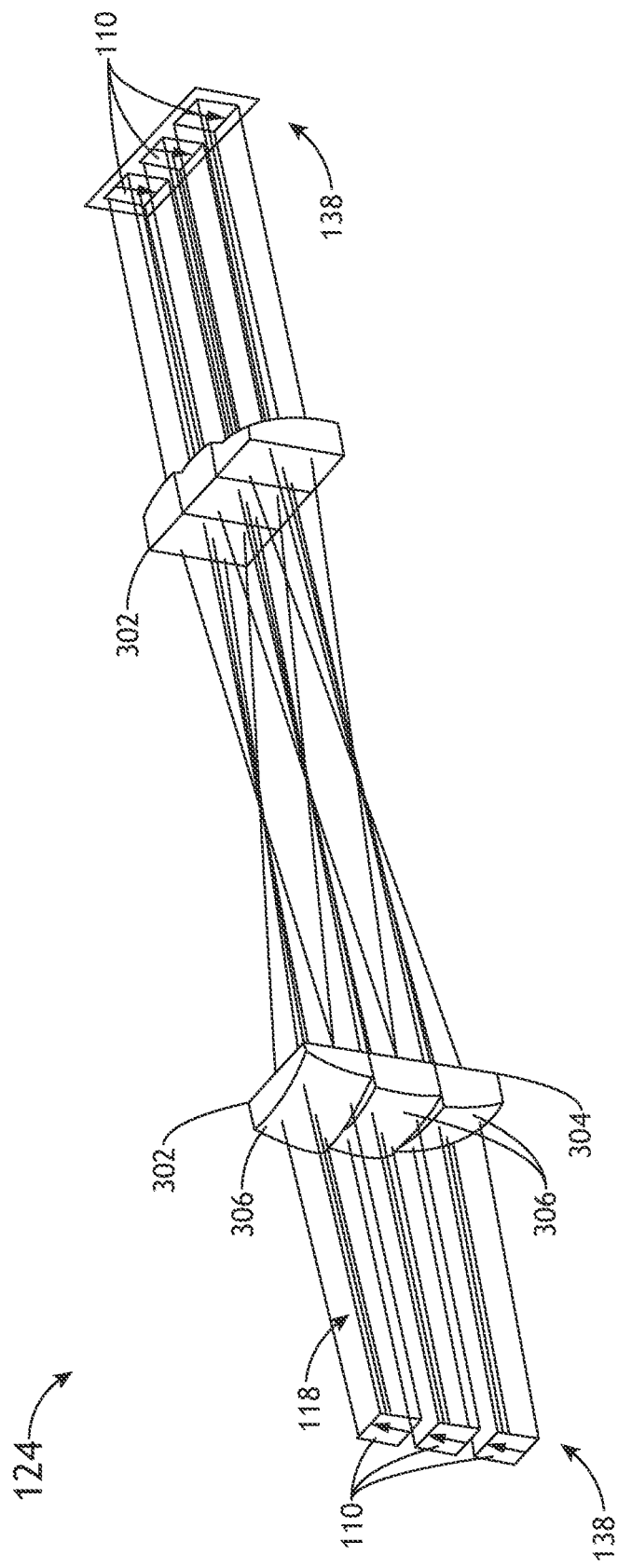
FIG. 3A is a perspective view of the field-repositioning optical relay in accordance with one or more embodiments of the present disclosure.
Figure 3B:
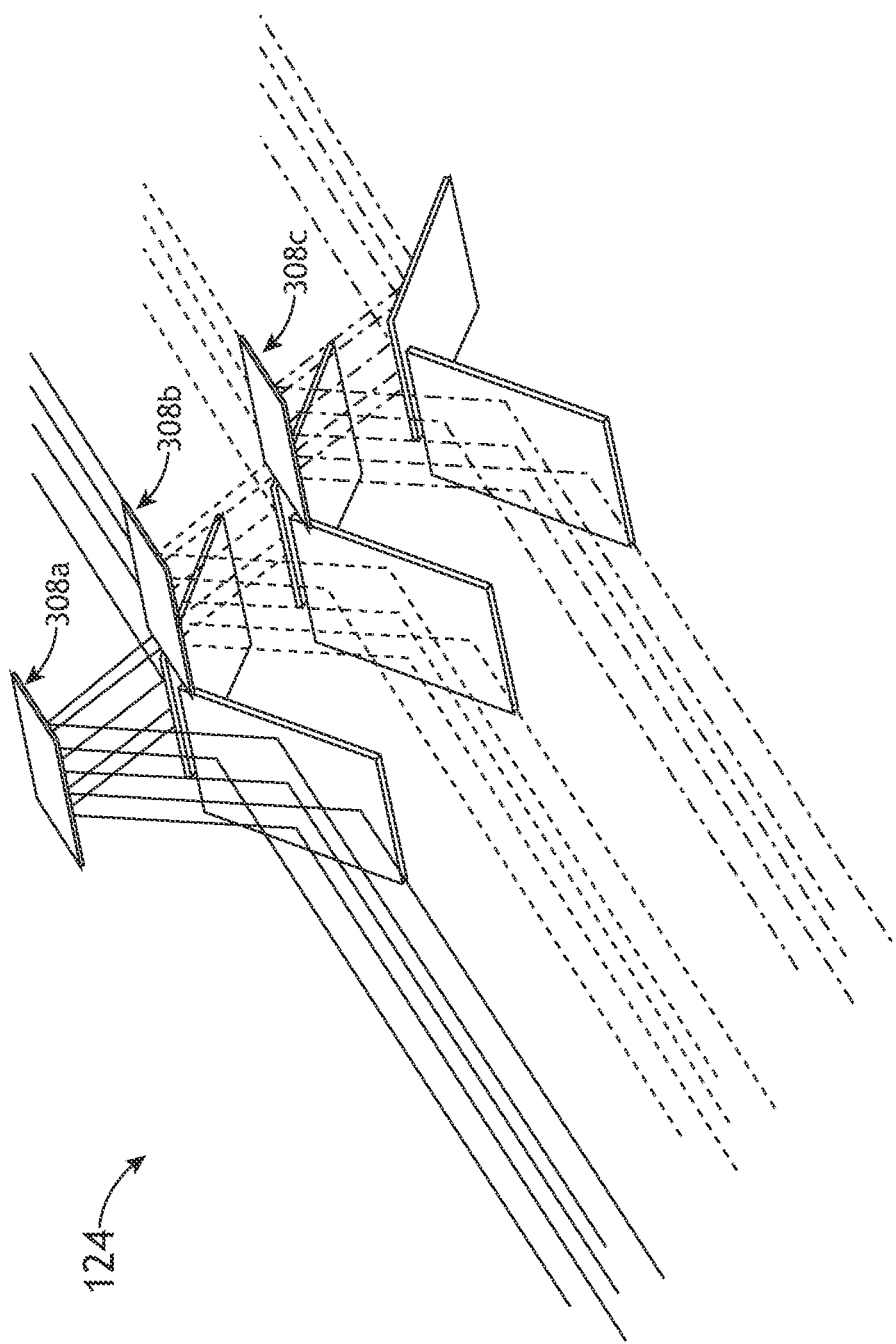
FIG. 3B is a perspective view of a series of k-mirrors to rotate images of the acquisition fields in accordance with one or more embodiments of the present disclosure.

FIG. 1B is a conceptual view of the imaging metrology tool 102 illustrating a single illumination channel 108 illuminating a single acquisition field 110, in accordance with one or more embodiments of the present disclosure. In this way, FIG. 1B illustrates various components of the scanning metrology system 100 that may be included in any particular illumination channel 108 or collection channel 122. FIGS. 1B and 10 generally illustrate various configurations of the illumination sub-system 106 and the imaging sub-system 116. FIGS. 3A and 3B illustrate the operation of the field-repositioning optical relay 124.

In one embodiment, the imaging metrology tool 102 includes at least one illumination source 126 configured to generate one or more illumination beams 112. An illumination beam 112 from the illumination source 126 may include one or more selected wavelengths of light including, but not limited to, ultraviolet (UV) radiation, visible radiation, or infrared (IR) radiation. Further, an illumination beam 112 from the illumination source 126 may have any temporal profile including, but not limited to, a continuous-wave (CW) profile, a pulsed profile, or a modulated profile.

The illumination source 126 may generally include any type of illumination source suitable for providing at least one illumination beam 112. In one embodiment, the illumination source 126 is a laser source. For example, the illumination source 126 may include, but is not limited to, one or more narrowband laser sources, a broadband laser source, a supercontinuum laser source, a white light laser source, or the like. In this regard, the illumination source 126 may provide an illumination beam 112 having high coherence (e.g., high spatial coherence and/or temporal coherence). In another embodiment, the illumination source 126 includes a laser-sustained plasma (LSP) source. For example, the illumination source 126 may include, but is not limited to, a LSP lamp, a LSP bulb, or a LSP chamber suitable for containing one or more elements that, when excited by a laser source into a plasma state, may emit broadband illumination. In another embodiment, the illumination source 126 includes a lamp source. For example, the illumination source 126 may include, but is not limited to, an arc lamp, a discharge lamp, an electrode-less lamp, or the like. In this regard, the illumination source 126 may provide an illumination beam 112 having low coherence (e.g., low spatial coherence and/or temporal coherence).

The illumination sub-system 106 may include any number of illumination beams 112. In this way, a particular illumination source 126 may provide illumination for a single illumination channel 108 (e.g., as illustrated in FIG. 1B) or for multiple illumination channels 108 (e.g., using one or more beamsplitters or the like).

An illumination channel 108 may include one or more optical components suitable for modifying and/or conditioning an illumination beam 112 as well as directing the illumination beam 112 to the sample 104. In one embodiment, an illumination channel 108 includes one or more illumination-channel lenses 128 (e.g., to collimate the illumination beam 112, to relay pupil and/or field planes, or the like). In another embodiment, an illumination channel 108 includes one or more illumination-channel optics 130 to shape or otherwise control the illumination beam 112. For example, the illumination-channel optics 130 may include, but are not limited to, one or more illumination field stops, one or more illumination pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like). Further, the illumination-channel optics 130 may be located at any suitable location in the illumination channel 108 such as, but not limited to, an illumination pupil plane 132 or an illumination field plane 134. For instance, the imaging metrology tool 102 may include one or more relay optics (e.g., including one or more illumination-channel lenses 128) for providing an illumination pupil plane 132 and/or an illumination field plane 134.

In another embodiment, the imaging sub-system 116 includes an objective lens 136 to collect measurement light 118 from the acquisition fields 110 and direct the measurement light 118 to a scanning detector 120 located at a collection field plane 138 to generate an image of the sample 104.

In another embodiment, the field-repositioning optical relay 124 is positioned in the imaging sub-system 116 to reposition the acquisition fields 110 (e.g., as illustrated in FIGS. 2A-2C). For example, the field-repositioning optical relay 124 may relay images of the acquisition fields 110 between two collection field planes 138. Further, as illustrated in FIG. 1B, the scanning detector 120 may be located at one of the collection field planes 138.

In another embodiment, the imaging sub-system 116 includes two or more collection channels 122 to provide independent control of various optical parameters of the measurement light 118 from any of the acquisition fields 110. For example, a collection channel 122 may include one or more optical elements suitable for modifying and/or conditioning measurement light 118 from an acquisition field 110. In one embodiment, a collection channel 122 includes one or more collection-channel lenses 140 (e.g., to collimate the measurement light 118, to relay pupil and/or field planes, or the like), which may include, but is not required to include, the objective lens 136. In another embodiment, a collection channel 122 includes one or more collection-channel optics 142 to shape or otherwise control an illumination beam 112. For example, the collection-channel optics 142 may include, but are not limited to, one or more field stops, one or more pupil stops, one or more polarizers, one or more filters, one or more beamsplitters, one or more diffusers, one or more homogenizers, one or more apodizers, one or more beam shapers, or one or more mirrors (e.g., static mirrors, translatable mirrors, scanning mirrors, or the like). Further, the collection-channel optics 142 may be located at any suitable location such as, but not limited to, a collection pupil plane 144 or a collection field plane 138. For instance, the imaging metrology tool 102 may include one or more relay optics (e.g., including one or more collection-channel lenses 140) for providing a collection pupil plane 144 and/or a collection field plane 138. Additionally, it is contemplated herein that various components of the collection channels 122 such as collection-channel optics 142, collection-channel lenses 140, or the like may be located before or after the field-repositioning optical relay 124.

Figure 1C:
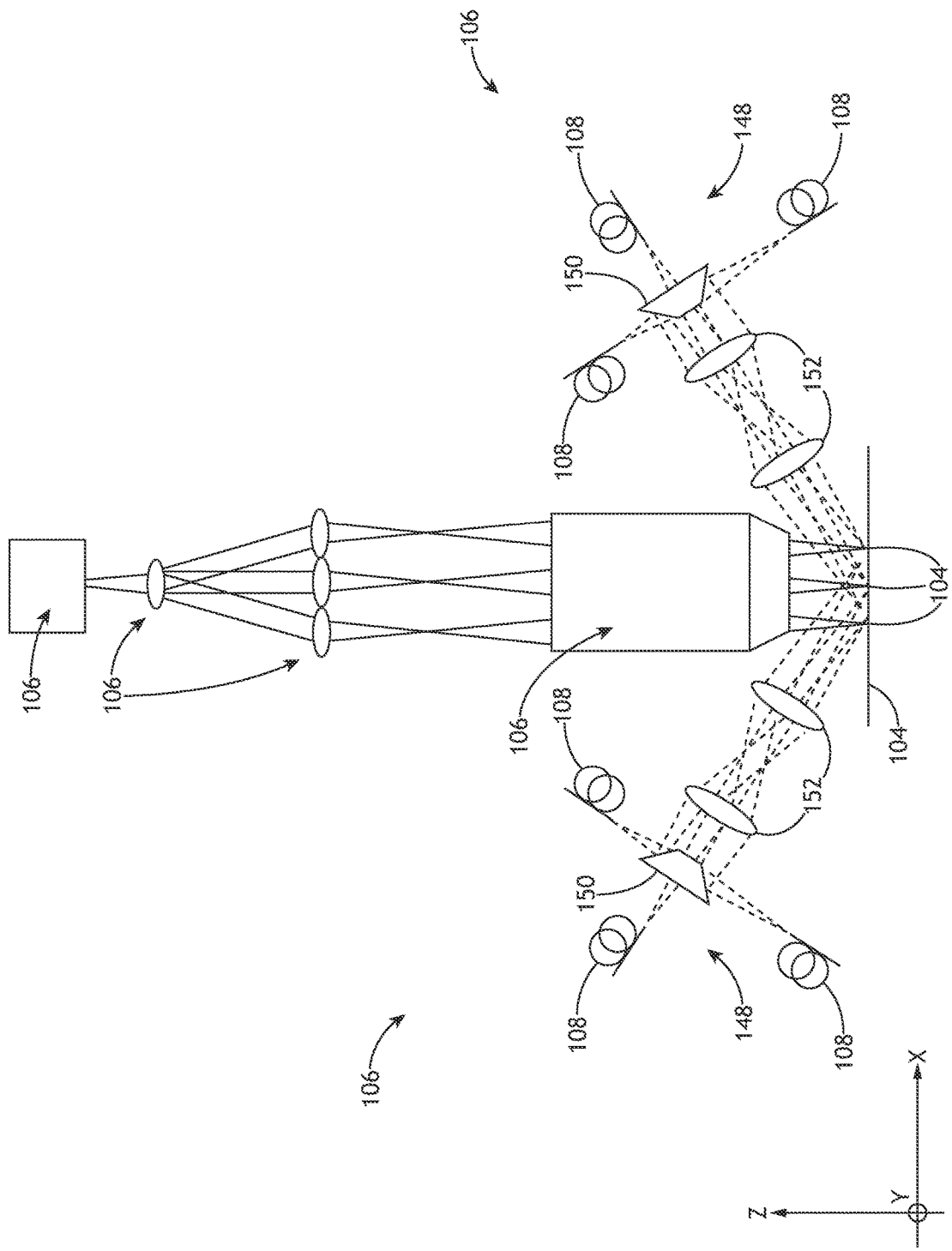
FIG. 1C is a conceptual view of an imaging metrology tool with six illumination channels providing outside-the-lens (OTL) dipole illumination for three acquisition fields in accordance with one or more embodiments of the present disclosure.

Referring now to FIGS. 1B and 1C, various configurations of the imaging metrology tool 102 for illuminating the acquisition fields 110 are described in greater detail in accordance with one or more embodiments of the present disclosure.

As described previously herein, the imaging metrology tool 102 may illuminate any particular acquisition field 110 with any number of illumination beams 112 from any number of illumination channels 108. Further, an acquisition field 110 may be illuminated with multiple illumination beams 112 simultaneously or sequentially. For example, the imaging metrology tool 102 may illuminate an acquisition field 110, simultaneously or sequentially, with normal illumination, single-pole oblique illumination, dipole illumination, quadrupole illumination, or any other desired illumination profile.

Further, the two or more acquisition fields 110 may be illuminated with different illumination conditions (e.g., associated with different measurement recipes) such as, but not limited to, intensity, wavelength, polarization, or incidence angle. In this way, a metrology target or other portion of the sample 104 to be measured may be illuminated with multiple illumination conditions in a single scan to facilitate one or more metrology measurements in the single scan.

In one embodiment, as illustrated in FIG. 1B, one or more illumination channels 108 direct an illumination beam 112 through the objective lens 136 to provide through-the-lens (TTL) illumination. In this configuration, the imaging metrology tool 102 may include a beamsplitter 146 to combine the beam paths for the imaging sub-system 116 and at least one illumination channel 108. Further, though not shown, multiple illumination channels 108 may provide TTL illumination. For example, light from multiple illumination channels 108 may be directed through the beamsplitter 146 at different locations and/or angles. By way of another example, a field mask may be placed at an illumination field plane 134 to provide multiple illumination beams 112 to be directed to multiple acquisition fields 110.

In another embodiment, as illustrated in FIG. 1C, one or more illumination channels 108 may direct an illumination beam 112 to an acquisition field 110 at incidence angles outside the numerical aperture (NA) of the objective lens 136 to provide outside-the-lens (OTL) illumination.

FIG. 1C is a conceptual view of an imaging metrology tool 102 with six illumination channels 108 providing OTL dipole illumination for three acquisition fields 110 in accordance with one or more embodiments of the present disclosure. In FIG. 1C, light from each of the illumination channels 108 is provided by separate optical fibers. Further, in FIG. 1C, the illumination sub-system 106 includes two illumination heads 148 to provide the dipole illumination for each of the acquisition fields 110. In this way, an illumination head may provide a set of common optical elements for directing illumination beams 112 from multiple illumination channels 108 towards the sample 104 such as, but not limited to, lenses, mirrors, prisms, filters, or the like. For example, the illumination heads 148 in FIG. 1C each include a prism 150 and a set of focusing lenses 152 to direct illumination beams 112 from three illumination channels 108 to the three acquisition fields 110 along a common direction (here, with azimuth incidence angles along the X-direction). Similarly, though not shown, the imaging metrology tool 102 may include additional illumination heads 148 to provide illumination of the acquisition fields 110 along additional directions such as, but not limited to, azimuth incidence angles along the Y-direction to provide quadrupole illumination.

However, it is to be understood that FIGS. 1B-1C and the associated description is provided solely for illustrative purposes and should not be interpreted as limiting. Rather, the imaging metrology tool 102 may include any number of illumination channels 108 to illuminate any number of acquisition fields 110 within the measurement field of view 204. Further, the imaging metrology tool 102 may include one or more illumination heads 148 such as, but not limited to, those illustrated in FIG. 1C to direct any number of illumination beams 112 to the sample 104 with common optical elements. Alternatively or additionally, the imaging metrology tool 102 may utilize separate optical elements to direct one or more illumination beams 112 to the sample 104.

Figure 3C:
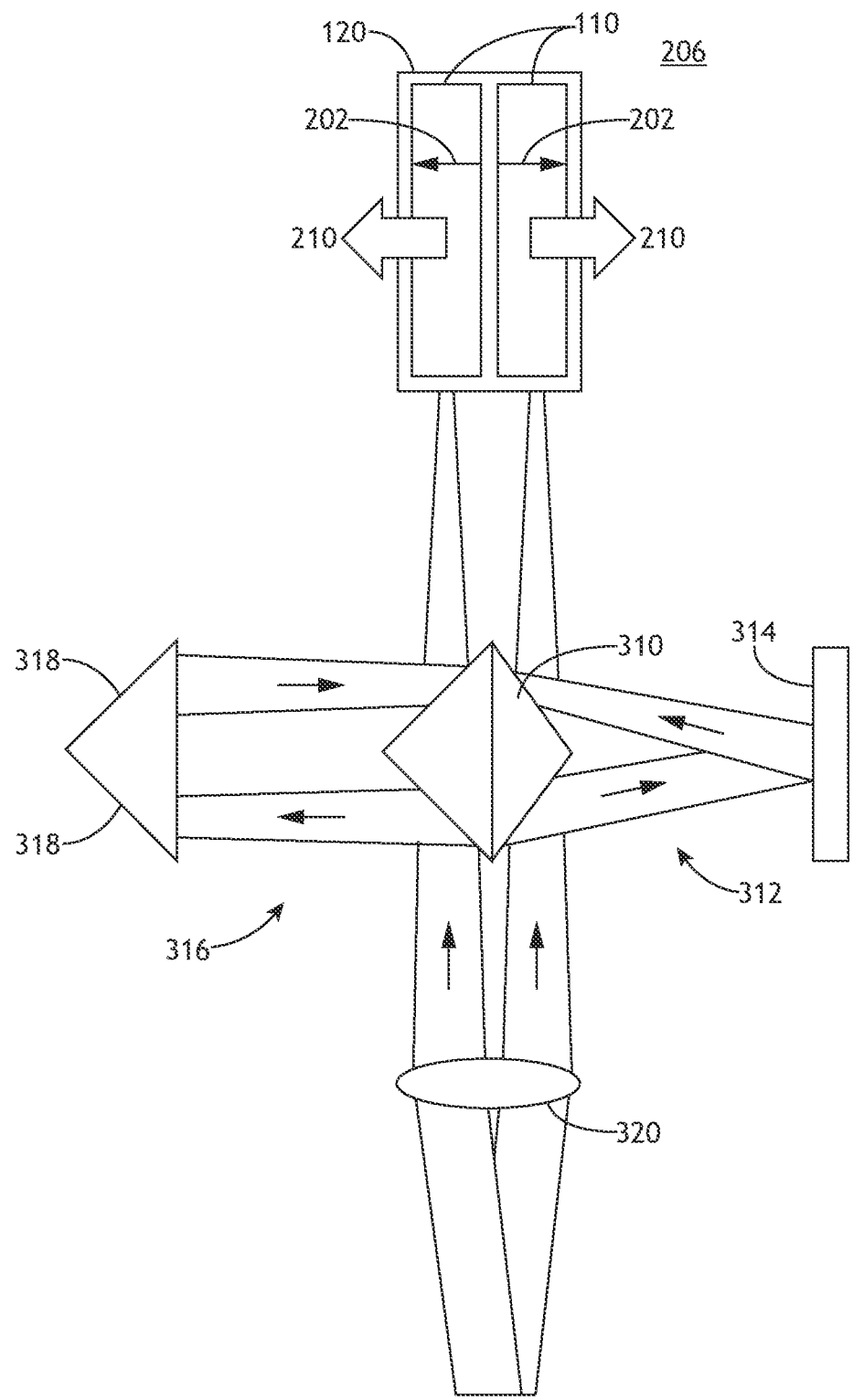
FIG. 3C is a top view of a field-repositioning optical relay arranged to arrange the acquisition fields on a detector with a bi-directional sensor located in an intermediate field plane in accordance with one or more embodiments of the present disclosure.

Referring now to FIGS. 3A-3C, various configurations of the field-repositioning optical relay 124 and the scanning detector 120 for imaging the acquisition fields 110 are described in greater detail in accordance with one or more embodiments of the present disclosure.

FIG. 3A is a perspective view of the field-repositioning optical relay 124 in accordance with one or more embodiments of the present disclosure. In one embodiment, the field-repositioning optical relay 124 includes multiple de-centered relay optics 302 to individually relay images of the acquisition fields 110 from one collection field plane 138 to another, position the images of the acquisition fields 110 along the column direction 206, and/or rotate the acquisition fields 110 such that the scan direction 202 in each of the acquisition fields 110 is orthogonal to the column direction 206 (e.g., as illustrated in FIG. 2B).

The de-centered relay optics 302 may include any type or combination of optical elements known in the art suitable for independently imaging, positioning, and/or rotating the acquisition fields 110. In one embodiment, as illustrated in FIG. 3A, the de-centered relay optics 302 are formed as segmented optical elements 304 with different surface profiles in each segment 306. In another embodiment, the de-centered relay optics 302 are formed from individual optical elements. In another embodiment, the de-centered relay optics 302 are formed from lens arrays, where the various lenses in the lens array are tailored to provide the desired repositioning of the acquisition fields 110 as illustrated in FIG. 2B and/or FIG. 2C. Further, the profiles of the various segments or lens elements may have any spherical or aspherical profile to provide the desired repositioning of the acquisition fields 110. For instance, the de-centered relay optics 302 may include spherical elements oriented in different directions. In another instance, the de-centered relay optics 302 may include one or more aspherical elements. As an illustration, FIG. 3A illustrates a pair of segmented optical elements 304, each having three segments 306 with individually tailored surface profiles to separately image, position and rotate the images of the acquisition fields 110.

In some embodiments, the field-repositioning optical relay 124 includes separate elements to rotate the images of the acquisition fields 110. For example, the field-repositioning optical relay 124 may separately rotate the images of the acquisition fields 110 with separate beam-rotating elements such as, but not limited to, k-mirrors or dove prisms. In this configuration, the de-centered relay optics 302 may adjust the relative positions of the acquisition fields 110 but need not rotate them.

FIG. 3B is a perspective view of a series of k-mirrors 308 to rotate images of the acquisition fields 110 in accordance with one or more embodiments of the present disclosure. In particular, FIG. 3B illustrates a first set of k-mirrors 308a to rotate an image of the acquisition field 110a, a second set of k-mirrors 308a to rotate an image of the acquisition field 110, and a third set of k-mirrors 308c to rotate an image of the acquisition field 110c. Further, the k-mirrors 308 in FIG. 3B are oriented to provide a 90 degree rotation of each of the acquisition fields 110 to provide that the scan direction 202 is orthogonal to the column direction 206 as illustrated in FIGS. 2B and 3A. Since k-mirrors 308 provide an optical rotation that is twice the physical rotation, the k-mirrors 308a,b,c are each oriented at 45 degrees to provide the 90 degree optical rotation.

FIG. 3C is a top view of a field-repositioning optical relay 124 arranged to arrange the acquisition fields 110 on a detector 120 with a bi-directional sensor located in an intermediate field plane 206 in accordance with one or more embodiments of the present disclosure. In one embodiment, the de-centered relay optics 302 include a beamsplitter 310 to split two acquisition fields 110 along two separate paths, one providing an odd number of reflections (e.g., folds) and one providing an even number of reflections (e.g., folds). In this way, the scan directions of the two acquisition fields 110 may be arranged to point in opposite directions in the intermediate field plane 206 for readout with a bi-directional sensor. For example, FIG. 3C illustrates a configuration in which the field-repositioning optical relay 124 includes a first path 312 with a mirror to provide a single reflective surface 314 (e.g., an odd number of reflections) and a second path 316 with a prism having two reflective surfaces 318 to provide two reflections (e.g., an even number of reflections). Further, the reflective surfaces in each of the paths of the field-repositioning optical relay 124 may be any type of reflective surfaces known in the art including, but not limited to, mirrors or prism surfaces. In another embodiment, the field-repositioning optical relay 124 includes one or more relay lenses 320 (or reflective optics) to relay the acquisition fields 110 to the intermediate field plane 206. For example, FIG. 3C illustrates a configuration in which the one or more relay lenses include a telecentric lens.

Referring now generally to FIGS. 1A-3B, it is contemplated herein that the imaging metrology tool 102 may generate multiple images of a metrology target or other portion of the sample 104 during a single scan as it passes through the multiple acquisition fields 110 distributed along the scan direction 202 in the measurement field of view 204. Further, the measurement recipe (e.g., various illumination and/or collection parameters) may be independently controlled for each of the acquisition fields 110. These multiple images may then be used to generate metrology data such as, but not limited to, overlay data. Further, it is contemplated herein that in some applications it may be beneficial to perform multiple scans of a particular metrology target or other portion of the sample to generate additional images with additional metrology recipes. However, even in such cases, the imaging metrology tool 102 may provide high-throughput measurements relative to tools that would generate a single image of the target per scan.

The following description provides various examples of the imaging metrology tool 102 used in the context of overlay metrology to more fully describe various benefits of the imaging metrology tool 102. However, it is to be understood that the imaging metrology tool 102 disclosed herein is not limited to overlay metrology and that the examples below are provided solely for illustrative purposes and should not be interpreted as limiting.

In one embodiment, the imaging metrology tool 102 illuminates the sample 104 with different combinations of illumination beams 112 at different incidence angles in multiple acquisition fields 110. In one embodiment, the imaging metrology tool 102 illuminates the sample 104 in one acquisition field 110 with an illumination beam 112 normal illumination, which may be suitable for, but is not limited to, overlay measurements along any direction. In another embodiment, the imaging metrology tool 102 illuminates the sample 104 with two illumination beams 112 arranged as a dipole at opposing azimuth angles (e.g., as illustrated in FIG. 1C), which may be useful for overlay measurements along the dipole direction. For example, the imaging metrology tool 102 may illuminate the sample 104 with the two opposing illumination beams 112 simultaneously in a single acquisition field 110 or sequentially in different acquisition fields 110. In another embodiment, the imaging metrology tool 102 illuminates the sample 104 with four illumination beams 112 arranged as a quadrupole (e.g., two dipoles oriented with orthogonal dipole directions), which may be suitable for overlay measurements along two orthogonal directions. For example, the imaging metrology tool 102 may illuminate the sample 104 with the four illumination beams 112 simultaneously in a single acquisition field 110. By way of another example, the imaging metrology tool 102 may illuminate the sample 104 with the four illumination beams 112 sequentially in four acquisition fields 110. By way of a further example, the imaging metrology tool 102 may illuminate the sample 104 with two illumination beams 112 (e.g., one in along each dipole direction) in a first acquisition field 110 and then with the two remaining illumination beams 112 in a second acquisition field 110.

In one embodiment, the imaging metrology tool 102 illuminates the sample 104 with different wavelengths of light in different acquisition fields 110. For example, a metrology measurement generated based on a combination of images generated at different wavelengths may be more accurate than a single image at a single wavelength in the case where the imaging metrology tool 102 and/or the algorithm used to generate the measurement is sensitive to wavelength.

In another embodiment, the imaging metrology tool 102 generates images at different focal planes in different acquisition field 110. For example, the different focal planes may correspond to depths of overlay target features on different sample layers. In this way, high-quality in-focus images of the different features on the different sample layers may be generated.

In some embodiments, one or more illumination channels 108 and/or one or more collection channels 122 are adjustable to facilitate selectable control of the measurement recipes associated with one or more of the acquisition fields 110 during runtime. In this regard, the imaging metrology tool 102 may be dynamically configured to provide a variety of measurements. In one embodiment, the measurement recipe for an acquisition field 110 is configurable prior to a measurement of a particular metrology target or other portion of the sample 104 to be measured. In another embodiment, the imaging metrology tool 102 rapidly alternates between two or more measurement recipes for an acquisition field 110 and generates an interleaved image of the acquisition field 110, where separate images of the sample 104 in the associated with the acquisition field 110 based on the different measurement recipes may be extracted from the interleaved image. Generating interleaved images associated with multiple metrology recipes is generally described in U.S. patent application Ser. No. 16/586,504 filed on Sep. 27, 2019, which is incorporated herein by reference in its entirety. In one embodiment, the imaging metrology tool 102 rapidly alternates between N metrology recipes and further directs image light to every Nth pixel column of a TDI sensor (e.g., using a lens array and/or masks on the remaining pixel columns). In this way, every Nth pixel row of a resulting interleaved image may be based on a common measurement recipe and separate images from each measurement recipe may be extracted.

Referring now again to FIG. 1A, additional components of the scanning metrology system 100 are described in greater detail in accordance with one or more embodiments of the present disclosure.

In another embodiment, the scanning metrology system 100 includes a controller 154 communicatively coupled to the imaging metrology tool 102 and/or any components therein.

In another embodiment, the controller 154 includes one or more processors 156. For example, the one or more processors 156 may be configured to execute a set of program instructions maintained in a memory device 158, or memory. The one or more processors 156 of a controller 154 may include any processing element known in the art. In this sense, the one or more processors 156 may include any microprocessor-type device configured to execute algorithms and/or instructions.

The one or more processors 156 of a controller 154 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 156 may include any device configured to execute algorithms and/or instructions (e.g., program instructions stored in memory). In one embodiment, the one or more processors 156 may be embodied as a desktop computer, mainframe computer system, workstation, image computer, parallel processor, networked computer, or any other computer system configured to execute a program configured to operate or operate in conjunction with the scanning metrology system 100, as described throughout the present disclosure. Moreover, different subsystems of the scanning metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 154 may include one or more controllers housed in a common housing or within multiple housings. In this way, any controller or combination of controllers may be separately packaged as a module suitable for integration into scanning metrology system 100.

The memory device 158 may include any storage medium known in the art suitable for storing program instructions executable by the associated one or more processors 156. For example, the memory device 158 may include a non-transitory memory medium. By way of another example, the memory device 158 may include, but is not limited to, a read-only memory (ROM), a random-access memory (RAM), a magnetic or optical memory device (e.g., disk), a magnetic tape, a solid-state drive and the like. It is further noted that the memory device 158 may be housed in a common controller housing with the one or more processors 156. In one embodiment, the memory device 158 may be located remotely with respect to the physical location of the one or more processors 156 and the controller 154. For instance, the one or more processors 156 of the controller 154 may access a remote memory (e.g., server), accessible through a network (e.g., internet, intranet and the like).

In this way, the controller 154 may direct (e.g., through control signals) or receive data from the imaging metrology tool 102 or any components therein. The controller 154 may further be configured to perform any of the various process steps described throughout the present disclosure such as, but not limited to, directing any of the illumination channels 108 and/or the collection channels 122 to generate one or more images based on one or more selected recipes, receiving images from the scanning detector 120, or generating metrology data based on the received images.

In one embodiment, the scanning metrology system 100 includes a user interface 160 communicatively coupled to the controller 154. In one embodiment, the user interface 160 may include, but is not limited to, one or more desktops, laptops, tablets, and the like. In another embodiment, the user interface 160 includes a display used to display data of the scanning metrology system 100 to a user. The display of the user interface 160 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 160 is suitable for implementation in the present disclosure. In another embodiment, a user may input selections and/or instructions responsive to data displayed to the user via a user input device of the user interface 160.

Figure 4:
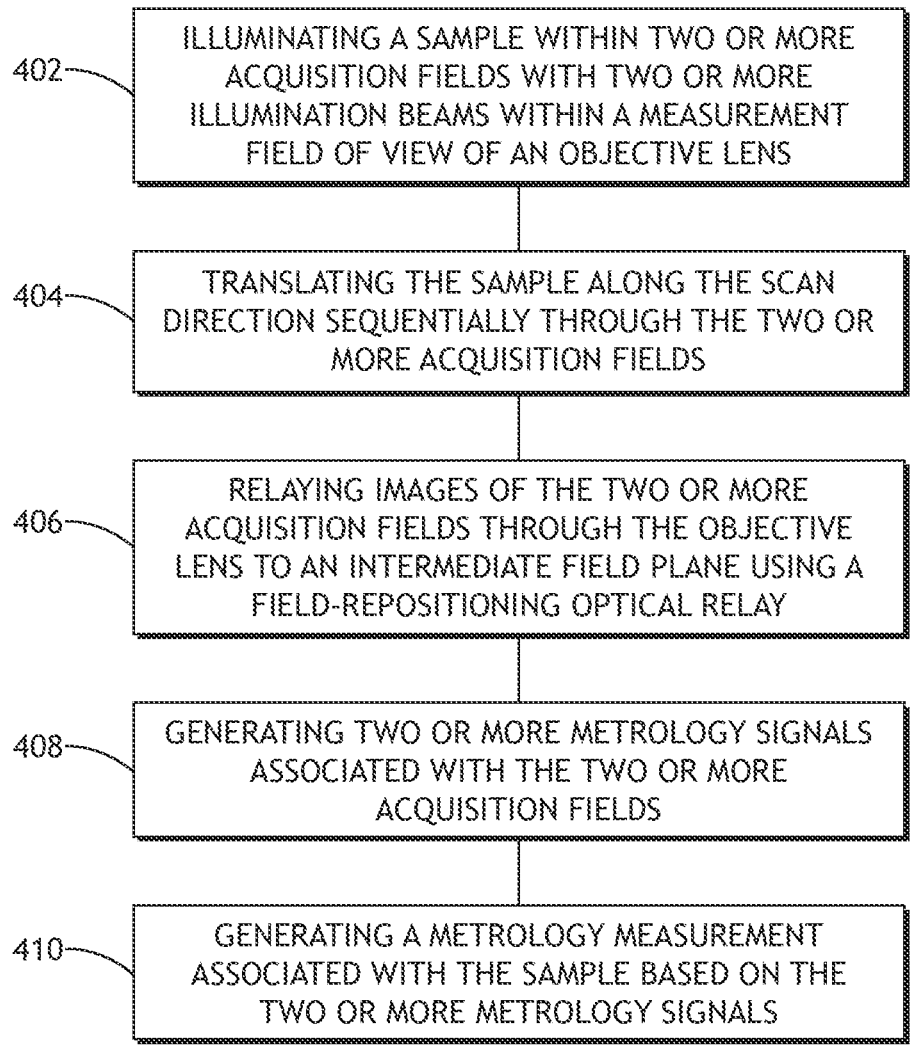
FIG. 4 is a flow diagram illustrating steps performed in a metrology method in accordance with one or more embodiments of the present disclosure.

Referring now to FIG. 4, a flow diagram illustrating steps performed in a metrology method 400 is described in accordance with one or more embodiments of the present disclosure. Applicant notes that the embodiments and enabling technologies described previously herein in the context of the scanning metrology system 100 should be interpreted to extend to the method 400. It is further noted, however, that the method 400 is not limited to the architecture of the scanning metrology system 100.

In one embodiment, the method 400 includes a step 402 of illuminating a sample within two or more acquisition fields with two or more illumination beams within a measurement field of view of an objective lens (or more generally an imaging system). In another embodiment, the method 400 includes a step 404 of translating the sample along the scan direction sequentially through the two or more acquisition fields. In another embodiment, the method 400 includes a step 406 of relaying images of the two or more acquisition fields through the objective lens to a scanning detector using a field-repositioning optical relay, where the field-repositioning optical relay positions the images of the two or more acquisition fields on the scanning detector along the column direction such that the scan direction in the two or more acquisition fields is orthogonal to the column direction. In another embodiment, the method 400 includes a step 408 of generating two or more images of the sample associated with the two or more acquisition fields.

In this way, two or more images of a metrology target or any other portion of the sample to be measured may be generated in the two or more acquisition fields according to two or more different measurement recipes in a single scan. A measurement recipe may include any combination of illumination or collection conditions associated with an acquisition field such as, but not limited to, an intensity of illumination, a wavelength of illumination, a polarization of illumination, an illumination angle, an imaging depth of field, a collection angle, a wavelength of collected light, a polarization of collected light, or the like.

In another embodiment, the method 400 includes a step 410 of generating a metrology measurement associated with the sample based on the two or more images. For example, the step 410 may include generating an overlay measurement associated with a relative displacement of features generated by two or more lithography steps in one or more layers of a sample.

As an illustrative example, sequential images of an overlay metrology target may be generated with opposing dipole illumination beams along one or more azimuth directions in a single scan by illuminating the overlay target with a first dipole illumination beam in a first acquisition field and illuminating the overlay target with an opposing illumination beam in a second acquisition field. Accordingly, an overlay measurement may be generated based on the two images of the metrology target in the two acquisition fields. It is to be understood, however, that this example is provided merely for illustrative purposes and should not be interpreted as limiting. Rather, any combination of images suitable for one or more metrology algorithms may be generated in a single scan by utilizing selected measurement recipes in each of the two or more acquisition fields.

For the purposes of the present disclosure, the term overlay is generally used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

While in some applications overlay measurements may be performed directly on features of a fabricated device (e.g., device features), overlay measurements are commonly performed on dedicated overlay targets printed using the same lithography steps as the device features. In this way, the features of an overlay target (e.g., target features) may be specially designed to facilitate overlay measurements. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

However, it is to be understood that the systems and methods disclosed herein are not limited to overlay metrology, but may rather be applicable to a variety of optical metrology measurements such as, but not limited to, process metrology measurements. For example, process metrology may be associated with measurements of the exposure fluence and/or dose of illumination during a lithography step. In this regard, references to overlay metrology are intended to be illustrative rather than limiting.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology tool comprising:
   an illumination sub-system including one more optical components configured to illuminate a sample within two or more acquisition fields with two or more illumination beams, wherein the two or more acquisition fields are distributed along a scan direction in a non-overlapping configuration, wherein a translation stage translates a metrology target on the sample along the scan direction sequentially through the two or more acquisition fields, wherein the illumination sub-system is configured to alternately illuminate at least one of the two or more acquisition fields with two or more measurement recipes while the sample is scanned, wherein portions of an image associated with the at least one of the two or more acquisition fields includes an interleaved image associated with the two or more measurement recipes; and
   an imaging sub-system configured to image the two or more acquisition fields while the sample is scanned along the scan direction by the translation stage, wherein the imaging sub-system comprises:
     an objective lens configured to capture light from a sample within a measurement field of view, wherein the two or more acquisition fields are within the measurement field of view;
     a scanning detector including one or more pixel columns distributed along a column direction configured to generate two or more images of the two or more acquisition fields as the sample is scanned; and
     a field-repositioning optical relay to relay images of the two or more acquisition fields to the scanning detector, wherein the field-repositioning optical relay positions the images of the two or more acquisition fields on the scanning detector along the column direction such that the scan direction in the two or more acquisition fields is orthogonal to the column direction.

2. The metrology tool of claim 1, wherein the scanning detector comprises:
   a time-domain integration (TDI) detector, wherein the scan direction in the two or more re-positioned acquisition fields is aligned with a charge-transfer direction of the TDI detector.

3. The metrology tool of claim 1, wherein measurement recipes including configurations of the at least one of the illumination sub-system or the imaging sub-system are different for at least some of the two or more acquisition fields.

4. The metrology tool of claim 3, wherein the configurations of the at least one of the illumination sub-system or the imaging sub-system associated with the measurement recipes comprise:
   at least one of an intensity, a wavelength, a polarization, or an incidence angle of at least one of the two or more illumination beams.

5. The metrology tool of claim 3, wherein the configurations of the at least one of the illumination sub-system or the imaging sub-system associated with the measurement recipes comprise:
   at least one of an intensity, a wavelength, a polarization, a collection angle of light directed to the scanning detector.

6. The metrology tool of claim 3, wherein the configurations of the at least one of the illumination sub-system or the imaging sub-system associated with the measurement recipes comprise:
   an imaging depth of the imaging sub-system.

7. The metrology tool of claim 1, wherein the illumination sub-system includes two or more illumination channels to illuminate the two or more acquisition fields with two or more illumination beams.

8. The metrology tool of claim 7, wherein at least one of the two or more illumination channels direct at least one of the two or more illumination beams to at least one of the two or more acquisition fields at illumination angles larger than a numerical aperture of the objective lens.

9. The metrology tool of claim 7, wherein at least one of the two or more illumination channels direct at least one of the two or more illumination beams to at least one of the two or more acquisition fields through the objective lens.

10. The metrology tool of claim 7, wherein the two or more acquisition fields comprise:
    a first acquisition field, wherein the illumination sub-system illuminates the first acquisition field with at least one of the two or more illumination beams having a first spectrum; and
    a second acquisition field, wherein the illumination sub-system illuminates the first acquisition field with at least one of the two or more illumination beams having a second spectrum different than the first spectrum.

11. The metrology tool of claim 7, wherein the two or more acquisition fields comprise:
    a first acquisition field, wherein the illumination sub-system illuminates the first acquisition field with a first of the two or more illumination beams; and
    a second acquisition field, wherein the illumination sub-system illuminates the second acquisition field with a first of the two or more illumination beams having an azimuthal angle symmetrically opposite the first of the two or more illumination beams.

12. The metrology tool of claim 7, wherein the two or more acquisition fields comprise:
   a first acquisition field, wherein the illumination sub-system illuminates the first acquisition field with a first pair of the two or more illumination beams with orthogonal azimuthal angles; and
   a second acquisition field, wherein the illumination sub-system illuminates the second acquisition field with a second pair of the two or more illumination beams with orthogonal azimuthal angles, wherein the second pair of the two or more illumination beams is symmetrically opposite to the first pair of illumination beams.

13. The metrology tool of claim 1, wherein the field-repositioning optical relay comprises:
   one or more de-centered optical elements.

14. The metrology tool of claim 13, wherein the one or more de-centered optical elements comprise:
   at least one of one or more segmented optical elements having different surface profiles in two or more segments, one or more lens arrays, or one or more sets of individual optical elements.

15. The metrology tool of claim 13, wherein the one or more de-centered optical elements comprise:
   at least one beam rotator to rotate an image of at least one of the two or more acquisition fields.

16. The metrology tool of claim 15, wherein the at least one beam rotator comprises:
   at least one of a k-mirror or a dove prism.

17. A metrology tool comprising:
   one or more illumination sources;
   a translation stage configured to translate a sample along a scan direction;
   an illumination sub-system including one more optical components configured to illuminate a sample within two or more acquisition fields with two or more illumination beams from the one or more illumination sources, wherein the two or more acquisition fields are distributed along a scan direction in a non-overlapping configuration, wherein the translation stage translates a metrology target on the sample along the scan direction sequentially through the two or more acquisition fields, wherein the illumination sub-system is configured to alternately illuminate at least one of the two or more acquisition fields with two or more measurement recipes while the sample is scanned, wherein portions of an image associated with the at least one of the two or more acquisition fields includes an interleaved image associated with the two or more measurement recipes;
   an imaging sub-system configured to image the two or more acquisition fields while the sample is scanned along the scan direction by the translation stage, wherein the imaging sub-system comprises:
      an objective lens configured to capture light from a sample within a measurement field of view, wherein the two or more acquisition fields are within the measurement field of view;
      a scanning detector including one or more pixel columns distributed along a column direction configured to generate two or more images of the two or more acquisition fields as the sample is scanned; and
      a field-repositioning optical relay to relay images of the two or more acquisition fields to the scanning detector, wherein the field-repositioning optical relay positions the images of the two or more acquisition fields on the scanning detector along the column direction such that the scan direction in the two or more acquisition fields is orthogonal to the column direction; and
   a controller communicatively coupled to the imaging sub-system, the controller including one or more processors configured to execute program instructions causing the one or more processors to:
      receive two or more images of the sample associated with the two or more acquisition fields; and
      generate a metrology measurement associated with the sample based on the two or more images.

18. The metrology tool of claim 17, wherein the metrology measurement comprises:
   an overlay measurement.

19. The metrology tool of claim 17, wherein the metrology target includes non-overlapping features on one or more sample layers.

20. The metrology tool of claim 17, wherein the metrology target comprises:
   a grating-over-grating overlay target including periodic features on two or more sample layers in overlapping regions.

21. The metrology tool of claim 17, wherein the scanning detector comprises:
   a time-domain integration (TDI) detector, wherein the scan direction in the two or more re-positioned acquisition fields is aligned with a charge-transfer direction of the TDI detector.

22. The metrology tool of claim 17, wherein measurement recipes including configurations of the at least one of the illumination sub-system or the imaging sub-system are different for at least some of the two or more acquisition fields.

23. The metrology tool of claim 22, wherein the configurations of the at least one of the illumination sub-system or the imaging sub-system associated with the measurement recipes comprise:
   at least one of an intensity, a wavelength, a polarization, or an incidence angle of at least one of the two or more illumination beams.

24. The metrology tool of claim 22, wherein the configurations of the at least one of the illumination sub-system or the imaging sub-system associated with the measurement recipes comprise:
   at least one of an intensity, a wavelength, a polarization, a collection angle of light directed to the scanning detector.

25. The metrology tool of claim 22, wherein the configurations of the at least one of the illumination sub-system or the imaging sub-system associated with the measurement recipes comprise:
   an imaging depth of the imaging sub-system.

26. The metrology tool of claim 17, wherein the illumination sub-system includes two or more illumination channels to illuminate the two or more acquisition fields with two or more illumination beams.

27. The metrology tool of claim 26, wherein at least one of the two or more illumination channels direct at least one of the two or more illumination beams to at least one of the two or more acquisition fields at illumination angles larger than a numerical aperture of the objective lens.

28. The metrology tool of claim 26, wherein at least one of the two or more illumination channels direct at least one of the two or more illumination beams to at least one of the two or more acquisition fields through the objective lens.

29. The metrology tool of claim 26, wherein the two or more acquisition fields comprise:

a first acquisition field, wherein the illumination subsystem illuminates the first acquisition field with at least one of the two or more illumination beams having a first spectrum; and a second acquisition field, wherein the illumination subsystem illuminates the first acquisition field with at least one of the two or more illumination beams having a second spectrum different than the first spectrum.

30. The metrology tool of claim 26, wherein the two or more acquisition fields comprise:

a first acquisition field, wherein the illumination subsystem illuminates the first acquisition field with a first of the two or more illumination beams; and a second acquisition field, wherein the illumination subsystem illuminates the second acquisition field with a first of the two or more illumination beams having an azimuthal angle symmetrically opposite the first of the two or more illumination beams.

31. The metrology tool of claim 26, wherein the two or more acquisition fields comprise:

a first acquisition field, wherein the illumination subsystem illuminates the first acquisition field with a first pair of the two or more illumination beams with orthogonal azimuthal angles; and a second acquisition field, wherein the illumination subsystem illuminates the second acquisition field with a second pair of the two or more illumination beams with orthogonal azimuthal angles, wherein the second pair of the two or more illumination beams is symmetrically opposite to the first pair of illumination beams.

32. The metrology tool of claim 17, wherein the field-repositioning optical relay comprises:

one or more de-centered optical elements.

33. The metrology tool of claim 32, wherein the one or more de-centered optical elements comprise:

at least one of one or more segmented optical element having different surface profiles in two or more segments, one or more lens arrays, or one or more sets of individual optical elements.

34. The metrology tool of claim 32, wherein the one or more de-centered optical elements comprise:

at least one beam rotator to rotate image of at least one of the two or more acquisition fields.

35. The metrology tool of claim 34, wherein the at least one beam rotator comprises:

at least one of a k-mirror or a dove prism.

36. A metrology method comprising:

illuminating a sample within two or more acquisition fields with two or more illumination beams within a measurement field of view of an objective lens, wherein the two or more acquisitions are distributed along a scan direction in a non-overlapping configuration, wherein at least one of the two or more acquisition fields is alternately illuminated with two or more measurement recipes while the sample is scanned, wherein portions of an image associated with the at least one of the two or more acquisition fields includes an interleaved image associated with the two or more measurement recipes;

translating the sample along the scan direction sequentially through the two or more acquisition fields;

relaying images of the two or more acquisition fields through the objective lens to a scanning detector using a field-repositioning optical relay, wherein the field-repositioning optical relay positions the images of the two or more acquisition fields on the scanning detector along the column direction such that the scan direction in the two or more acquisition fields is orthogonal to the column direction;

generating two or more images of the sample associated with the two or more acquisition fields; and generating a metrology measurement associated with the sample based on the two or more images.

* * * * *